United States Patent
Koike et al.

(10) Patent No.: US 8,095,896 B2
(45) Date of Patent: Jan. 10, 2012

(54) METHOD AND SYSTEM OF DISPLAYING AN EXPOSURE CONDITION

(75) Inventors: Hirohito Koike, Hitachinaka (JP); Hidetoshi Morokuma, Hitachinaka (JP); Chie Shishido, Kawasaki (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1000 days.

(21) Appl. No.: 12/031,782

(22) Filed: Feb. 15, 2008

(65) Prior Publication Data
US 2008/0204405 A1 Aug. 28, 2008

(30) Foreign Application Priority Data
Feb. 16, 2007 (JP) ................................ 2007-036521

(51) Int. Cl.
*G06F 17/50* (2006.01)

(52) U.S. Cl. ............. 716/54; 716/51; 716/139; 700/121

(58) Field of Classification Search .......................... None
See application file for complete search history.

(56) References Cited

U.S. PATENT DOCUMENTS

| | | | | |
|---|---|---|---|---|
| 6,909,930 B2 * | 6/2005 | Shishido et al. | ............... | 700/121 |
| 6,913,861 B2 * | 7/2005 | Shishido et al. | ................ | 430/30 |
| 7,685,560 B2 * | 3/2010 | Nagatomo et al. | ............... | 716/51 |
| 2005/0221207 A1 | 10/2005 | Nagatomo et al. | | |
| 2007/0198955 A1 * | 8/2007 | Nagatomo et al. | ................ | 716/1 |

FOREIGN PATENT DOCUMENTS

| | | |
|---|---|---|
| JP | 2003-173948 A | 6/2003 |
| JP | 2005-286095 A | 10/2005 |

* cited by examiner

*Primary Examiner* — Leigh Garbowski

(74) *Attorney, Agent, or Firm* — Crowell & Moring LLP

(57) ABSTRACT

There is provided a device which may easily and visually judge which chip in an FEM wafer has a normal exposure condition, or which chip has an abnormal exposure condition. A feature quantity for a sectional shape of a resist pattern of an FEM wafer is calculated for each chip region on an FEM wafer using an image of a resist pattern for an FEM wafer. The feature quantity of a sectional shape is displayed for each chip in a chip table of a map representing a position of a chip region on the FEM wafer. Deviations in feature quantities of sectional shapes of resist patterns of a FEM wafer to an appropriate value are displayed in color in the chip table.

16 Claims, 6 Drawing Sheets

FIG. 5A
FIG. 5B
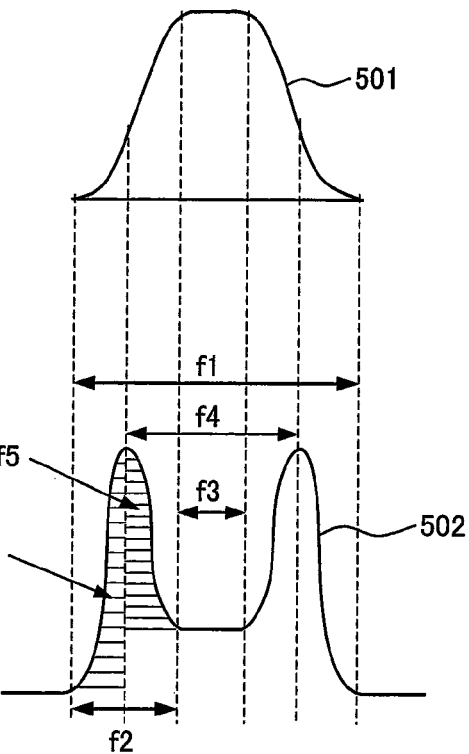
FIG. 6
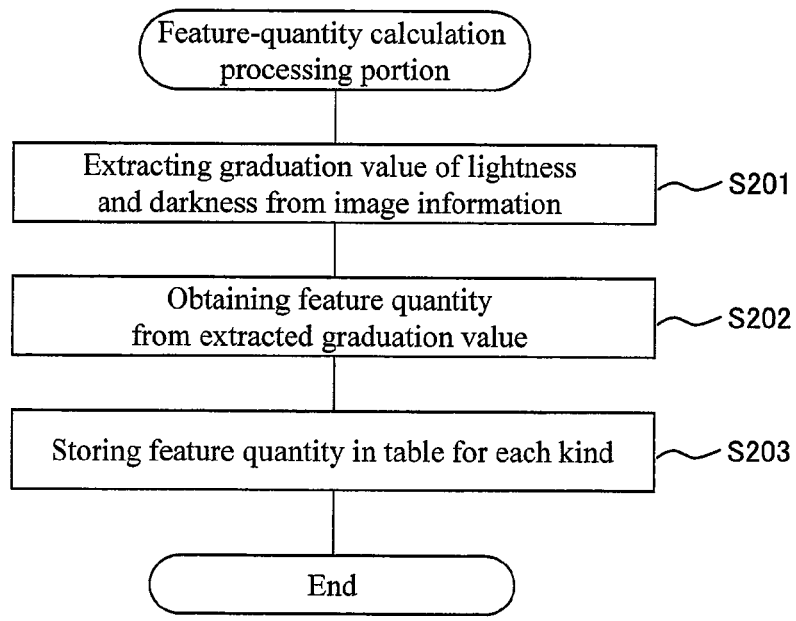

METHOD AND SYSTEM OF DISPLAYING AN EXPOSURE CONDITION

BACKGROUND OF THE INVENTION

1. Field of the Invention

The present invention relates to an inspection technology in a semiconductor device manufacturing process, especially, to a technology for displaying an exposure condition in an exposure process.

2. Description of the Related Art

When a semiconductor substrate of a new type is manufactured in a manufacturing process for a semiconductor device, an operation for searching an optimal exposure condition in an exposure process, so called "conditioning operation" is executed before a product wafer is fed to a manufacturing process. A special wafer which is referred to as "focus & exposure matrix (FEM) wafer" is used for the above "conditioning operation".

When an optimal exposure condition obtained by the "conditioning operation" is used, a resist pattern having an accuracy within an allowable range may be obtained at first. However, there is not obtained a resist pattern having an accuracy within the allowable range as time has passed. The reason is that, as time has passed, there are caused drifts in various kinds of sensors in an exposing device, changes in the exposure sensitivities of resists, variances in post exposure bake (PEB) temperatures, and the like. The above phenomenon is called process variation. That is, the optimal exposure condition is changed with time due to the process variation.

Conventionally, the dimension of a resist pattern of a wafer actually manufactured has been measured in order to verify the presence of the process variation in manufacturing processes of a product wafer. When a variation in the dimensions is observed by the dimension measurement in the manufacturing process, it is judged that there is a process variation, and exposure conditions are changed.

Japanese Patent Application Laid-Open No. 2003-173948 has disclosed a technology in which model data for linking exposure conditions with a scanning electron image is made using a feature quantity obtained from a secondary electron signal, and a deviation amount from an appropriate condition for an exposure process to be monitored by collating a feature quantity obtained from a secondary electron signal with the model data is estimated.

Moreover, Japanese Patent Application Laid-Open No. 2005-286095 has disclosed a technology in which an appropriate exposure process may be kept by measuring not only a variation in exposure amounts, but also an accurate variation in focus positions.

In Japanese Patent Application Laid-Open No. 2003-173948, the dimension of a resist pattern for an FEM wafer is measured using a scanning electron microscope for length measuring (hereinafter, called a length measuring SEM), and it is judged whether a feature quantity is appropriate. Thereby, it has not visually been judged which chip on a wafer has a normal resist pattern, or which chip does not have a normal pattern.

SUMMARY OF THE INVENTION

An object of the present invention is to provide a device by which it may be visually judged in an easy manner which chip in an FEM wafer has a normal exposure condition, or which chip has an abnormal exposure condition.

According to the present invention, a feature quantity for a sectional shape of a resist pattern of an FEM wafer is calculated for each chip region on an FEM wafer using an image of a resist pattern for an FEM wafer. The above feature quantity of a sectional shape is displayed for each chip region on the FEM wafer.

According to the present invention, there is made a chip table in which chip regions on an FEM wafer are shown in a matrix. The chip table is a map in which coordinates of chip regions on an FEM wafer are shown. A feature quantity for a sectional shape of a resist pattern of the FEM wafer is displayed in the above chip table for each chip region on an FEM wafer.

In the chip table, a deviation in a feature quantity of a sectional shape of the resist pattern for the FEM wafer to an appropriate value is displayed in color. That is, a deviation value is displayed in gradation of a warm or cold color.

According to the present invention, it may be visually judged in an easy manner which chip in an FEM wafer has a normal exposure condition, or which chip has an abnormal exposure condition.

BRIEF DESCRIPTION OF THE DRAWINGS

FIG. 5A and FIG. 5B are views explaining a feature quantity of a sectional shape of a resist pattern of a FEM wafer;

FIG. 6 is a view explaining processing in a feature quantity calculation processing portion in an image analysis processing portion of a visual information management portion in the system of displaying an exposure condition according to the present invention;

DESCRIPTION OF REFERENCE NUMERALS

100: COMPUTER
101: VISUAL INFORMATION MANAGEMENT PORTION
102: INPUT DEVICE
103: DISPLAY DEVICE
104: INPUT PROCESS PORTION
104A: IMAGE INFORMATION READING PROCESSING PORTION
104B: PARAMETER PROCESSING PORTION
105: IMAGE ANALYSIS PROCESSING PORTION
105A: FEATURE QUANTITY CALCULATION PROCESSING PORTION
105B: FEATURE QUANTITY DEVIATION CALCULATION PROCESSING PORTION
106: VISUAL INFORMATION CONTROL PORTION
106A: MAP DRAWING PROCESSING PORTION

106B: FEATURE QUANTITY DISPLAY PROCESSING PORTION
106C: COLOR DISPLAY PROCESSING PORTION
106D: GRAPH DISPLAY PROCESSING PORTION
301 (301A, 301B, and 301C): LENGTH MEASURING SEM

DESCRIPTION OF THE PREFERRED EMBODIMENTS

Figure 1:
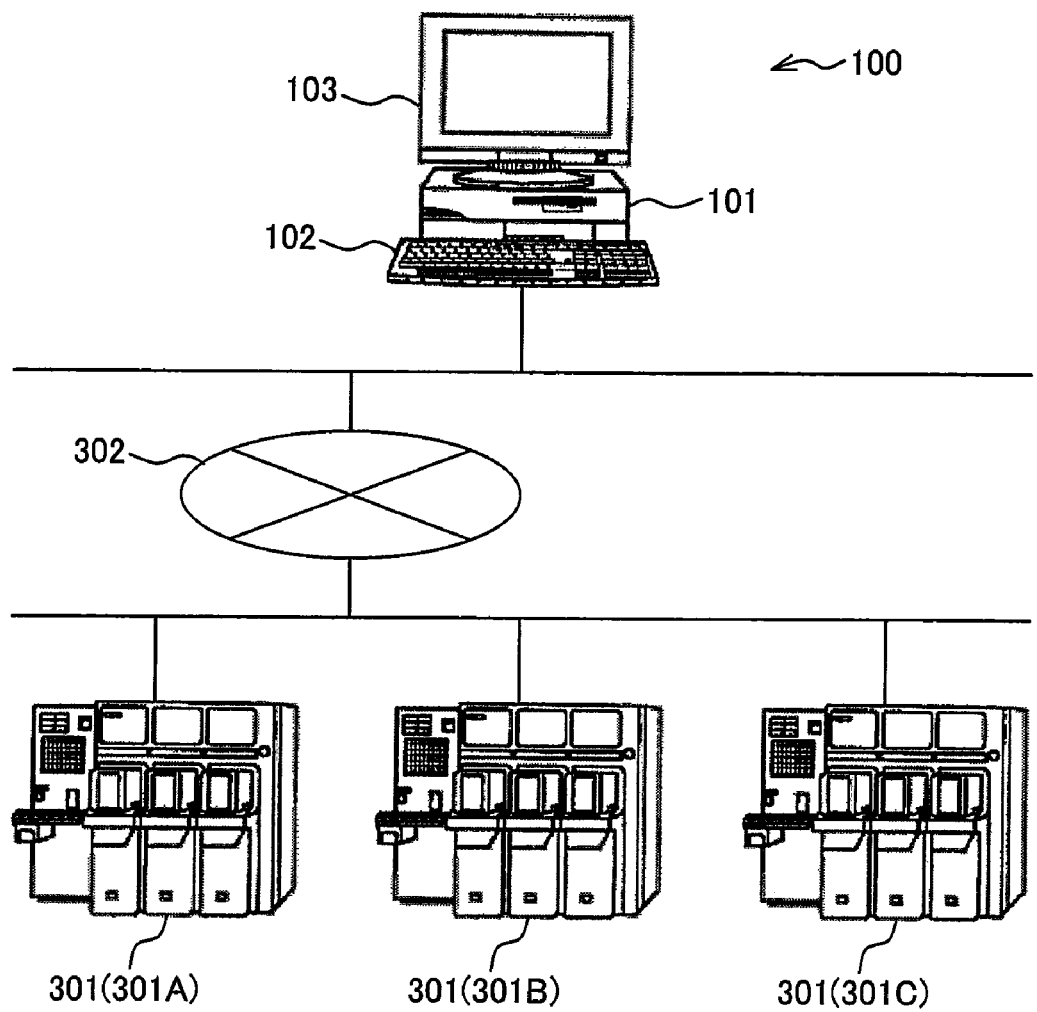
FIG. 1 is a view showing an example of a system of displaying an exposure condition according to the present invention.

One example of a system of displaying an exposure condition according to the present invention will be described referring to FIG. 1. The system of displaying an exposure condition according to the present example has a computer 100, and a plurality of length measuring SEMs 301 (301A, 301B, and 301C) connected to the computer 100 in parallel. The computer and the SEMs are connected to one another through a network 302. Though three length measuring SEMs 301 are connected to the computer 100 in FIG. 1, only one length measuring SEM 301 may be connected thereto, or four or more length measuring SEMs 301 may be connected. The computer 100 has a visual information management portion 101 including the main body of the computer, an input device 102 such as a keyboard and a mouse, and a display device 103. The visual information management portion 101 may be the main body of a usual personal computer having a CPU, a hard disk drive, a memory, a communication interface, and the like.

The length measuring SEM 301 is a scanning electron microscope with a length measuring function, and the dimension is measured using image information on a resist pattern of an FEM wafer. Image information on a resist pattern of an FEM wafer, which has been used for the above dimension measuring is sent to the visual information management portion 101 in the computer 100.

Figure 2:
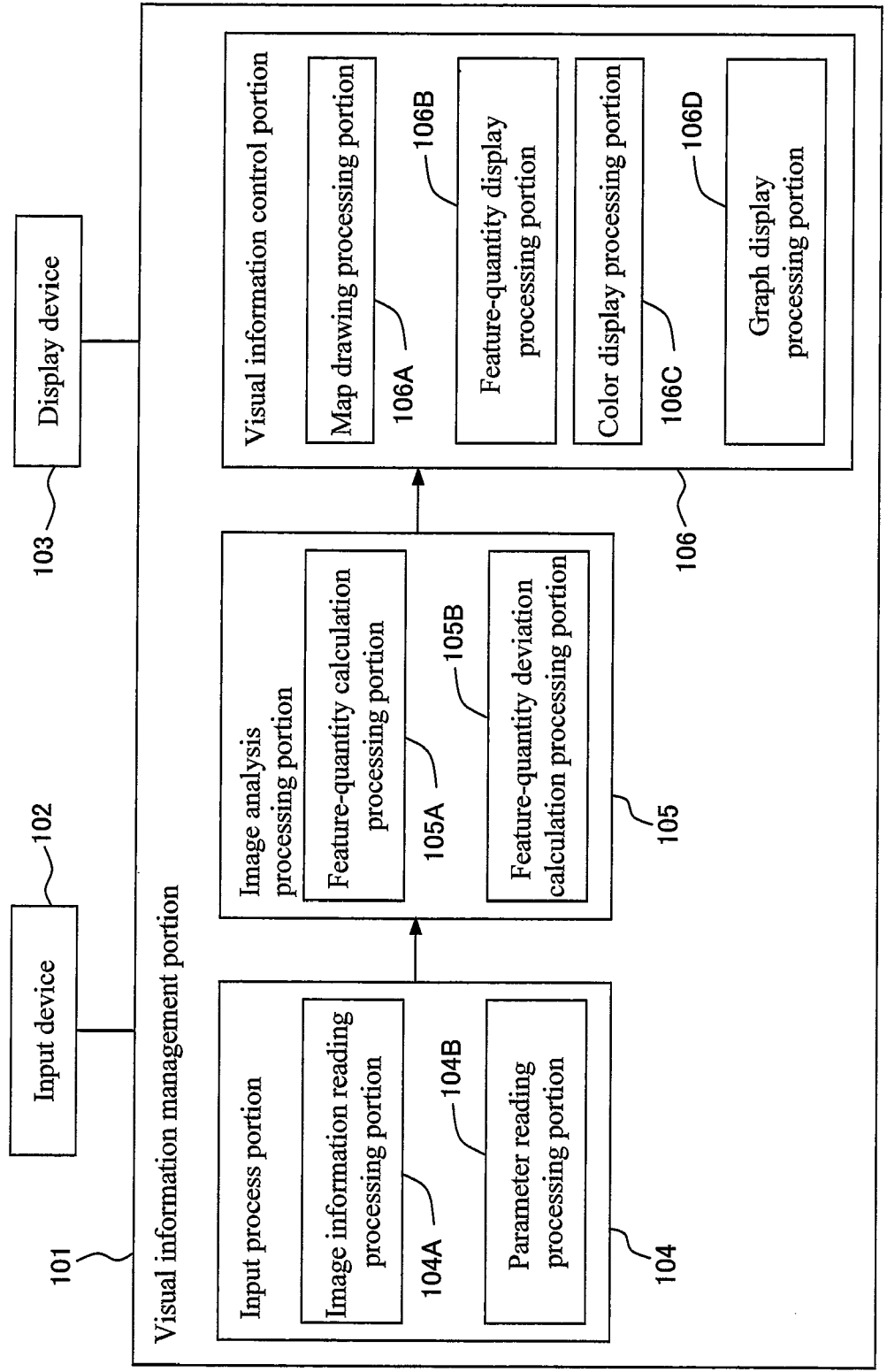
FIG. 2 is a view explaining a configuration and functions of a visual information management portion in the system of displaying an exposure condition according to the present invention.

A configuration and functions of the visual information management portion 101 will be explained referring to FIG. 2. The visual information management portion 101 has an input process portion 104, an image analysis processing portion 105, and a visual information control portion 106. The input device 102 and the display device 103 are connected to the visual information management portion 101. Image information on the resist pattern of a FEM wafer is sent from the length measuring SEM 301 to the visual information management portion 101.

The input process portion 104 has an image information reading processing portion 104A for acquiring image information on a resist pattern of the FEM wafer sent from the length measuring SEM 301 and a parameter processing portion 104B for specifying a scale width for color display of the chip table. The image analysis processing portion 105 has a feature quantity calculation processing portion 105A for obtaining a feature quantity of the sectional shape of a resist pattern by extracting a graduation value of lightness and darkness from the image information on a resist pattern of the FEM wafer, and a feature quantity deviation calculation processing portion 105B for obtaining a deviation of a feature quantity of the sectional shape of a resist pattern to an appropriate value.

The visual information control portion 106 has a map drawing processing portion 106A for making a chip table, a feature quantity display processing portion 106B for displaying a feature quantity of the sectional shape of a resist pattern on each chip in the chip table, a color display processing portion 106C for displaying a deviation in a feature quantity of the sectional shape of a resist pattern to an appropriate value in a warm or cold color; and a graph display processing portion 106D for graph display of changes in the feature quantity of the sectional shape of a resist pattern to the variations of the exposure condition.

Figure 3:
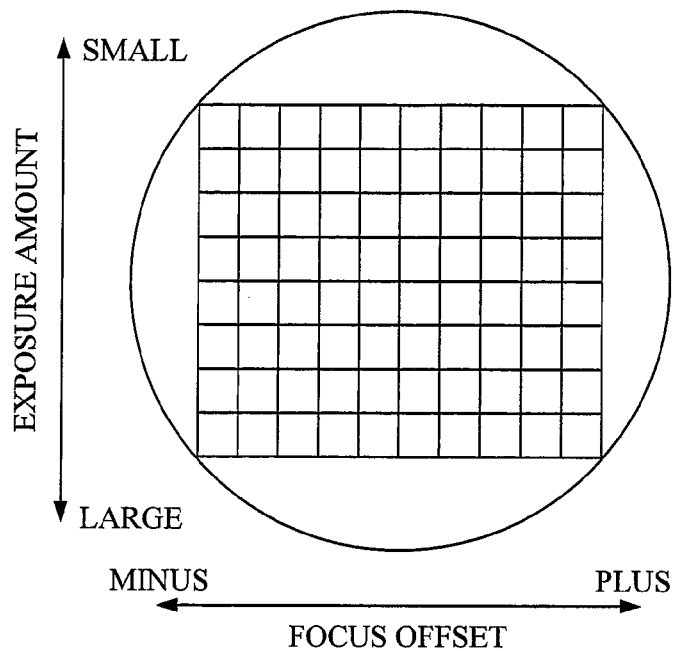
FIG. 3 is a view showing an example of a FEM wafer used for the system of displaying an exposure condition according to the present invention.

FIG. 3 shows an example of a FEM wafer used for the system of displaying an exposure condition according to the present invention. On the FEM wafer, the same patterns are baked on all the chip regions arranged in a grid pattern in a similar manner to that of the product wafer. However, the same patterns are baked on each of chip regions of a FEM wafer on different exposure conditions in a different manner from that of a product wafer. That is, each chip region is exposed on different exposure conditions for each shot as a unit of one exposure after a resist is applied on the each chip region. Here, the exposure condition includes a focus position and an exposure amount of a pattern. In FIG. 3, the vertical axis represents an exposure amount, and the horizontal axis represents an offset amount of a focus position. The exposure amount is at a medium level, and the offset amount of the focus position is zero in the chip region in the center of the above FEM wafer. The exposure amount is large in a chip region on the upper side from the center of the FEM wafer, and the exposure amount is small at the underside from the center. Similarly, the offset amount of the focus position is plus in a chip region at the right side from the center of the FEM wafer, and the offset amount of the focus position is minus in a chip region at the left side from the center of the FEM wafer.

When the FEM wafer is manufactured, "conditioning operation" is performed using the wafer. The dimension of a resist pattern on all chips arranged in a grid pattern is measured, using the length measuring SEM. An exposure condition for a chip with a high dimensional accuracy obtained from the measurement results is set as an optimal exposure condition. A product wafer is fed to a manufacturing process using the optimal exposure condition obtained as described above.

The flow of a lithography process according to the present invention will be explained referring to FIG. 4. First, a resist as an exposure material is applied on the substrate such as a semiconductor wafer with a predetermined thickness at step S101. At step S102, a mask pattern is exposed at a reduced magnification using an exposing device. As explained referring to FIG. 3, exposure is performed first by using the optimal exposure condition obtained by "conditioning operation" using the FEM wafer.

The resist pattern is formed at step S103 by developing the exposed mask pattern. At step S104, the dimension of the resist pattern is checked by the length measuring SEM. At step S105, it is judged whether the dimensional accuracy is in the allowable range. When the accuracy is in the allowable range, etching is performed at step S106, and the processing advances to the next process. When the accuracy is not in the allowable range, exposure conditions in the exposing device is changed at step S107, and the processing returns to step S102. That is, the optimal exposure condition set first is changed.

Figure 4:
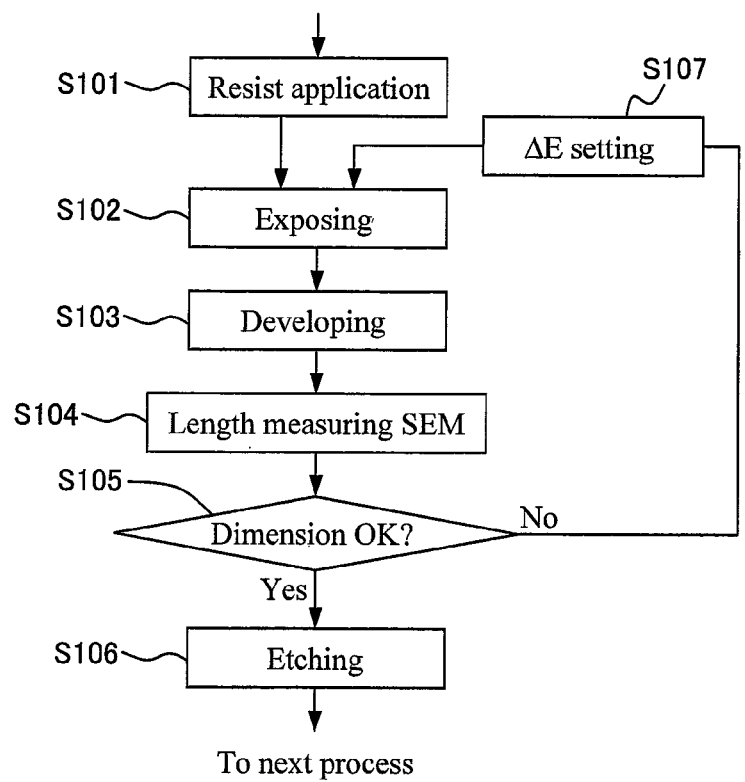
FIG. 4 is a view explaining a flow of a lithography process in a semiconductor manufacturing process according to the present invention.

In the example shown in FIG. 4, an exposure amount has been changed as an exposure condition. An correction amount of the exposure amount is $\Delta E$. For example, in the case of a positive-type resist, too large resist dimension causes an exposure amount to be increased, and too small resist dimension causes an exposure amount to be reduced. The increased or reduced exposure amount is determined in some cases, based on the experience and intuition of the worker.

A feature quantity of a sectional shape of a resist pattern on a FEM wafer will be explained referring to FIG. 5A and FIG. 5B. FIG. 5A is a schematic view of a sectional shape 501 of a resist pattern of the FEM wafer, and FIG. 5B is a view of a secondary electron signal strength distribution 502 of the resist pattern of the FEM wafer. The secondary electron signal strength distribution 502 is obtained at dimensional measurement using a length measuring SEM. As shown in FIG. 5B, the secondary electron signal strength is small in an area in which the section of the resist pattern is flat, and is large in an area in which the section of the resist pattern is inclined. Usually, the inclined region is colored white in an electronic microscope image. The following six feature quantities of f1 through f6 have been known as a parameter representing a sectional shape 501 of the resist pattern.

A bottom width f1 represents the broadest width of a root portion in the sectional shape of a resist pattern. A white band width f2 represents the width of each inclined portion at the both sides of the sectional shape of a resist pattern. A top width f3 represents the width of a flat top portion in the sectional shape of a resist pattern. A maximum inclination point interval f4 represents a distance between maximum inclination points in the inclination portions on the both sides in the sectional shape of a resist pattern. An average width f5 at the inside of the white band represents a dimension of a transition portion from the inclination portion to the top portion in the sectional shape of the resist pattern. An average width f6 at the outside of the white band represents a dimension of a transition portion from the root portion to the inclination portion in the sectional shape of the resist pattern.

The bottom width f1 is obtained by measuring the width of the root portion of the whole of the secondary electron signal strength distribution 502. The white band width f2 is obtained by measuring the width of each of the root portions of two mountains in the secondary electron signal strength distribution 502. The top width f3 is obtained by measuring the width of the flat portion of the secondary electron signal strength distribution 502. The maximum inclination point interval f4 is obtained by measuring a distance between the tops of two mountains in the secondary electron signal strength distribution 502. The average inside width f5 in the white band is obtained by measuring an average width of inside inclination portions of two mountains of the secondary electron signal strength distribution 502. The average outside width f6 of the white band is obtained by measuring the average width of the outside inclination portions of two mountains in the secondary electron signal strength distribution 502.

Processing in the feature quantity calculation processing portion 105A in the image analysis processing portion 105 will be explained referring to FIG. 6. At step S201, the feature quantity calculation processing portion 105A calculates a graduation value of lightness and darkness from the image information on a resist pattern of the FEM wafer, and obtains a secondary electron signal strength distribution 502 of FIG. 5B from a change in the graduation value of lightness and darkness. At step S202, the feature quantity calculation processing portion 105A obtains the feature quantities f1 through f6 of the sectional shape of the resist pattern by analyzing the secondary electron signal strength distribution 502. At step S203, the feature quantities of the sectional shape of the resist pattern are stored in the table for every kind of the amounts.

Figure 7:
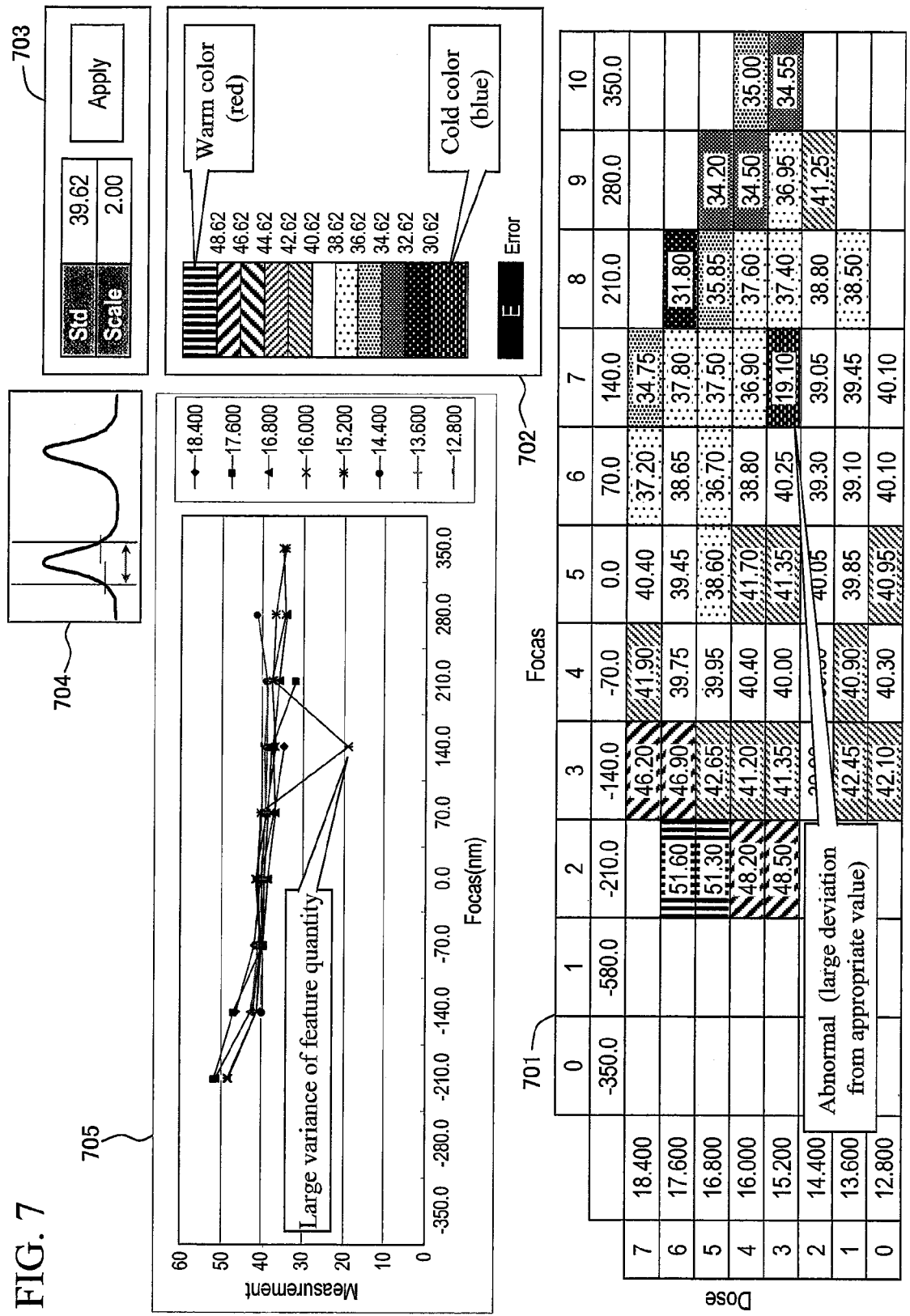
FIG. 7 is a view showing an example of a screen displayed on a display device in a system of displaying an exposure condition according to the present invention.

FIG. 7 shows an example of a screen on which feature quantities of sectional shapes of resist patterns of a FEM wafer are displayed on the display device 103 of the system of displaying an exposure condition according to the present invention. The above screen includes: a chip table 701; a color display area 702 in which there are displayed a relation between deviations of feature quantities of the sectional shapes of resist patterns on a FEM wafer to an appropriate value and samples of cold colors or warm colors displaying the deviations; an input area 703 in which an appropriate value of the feature quantities of the sectional shape of the resist pattern of the FEM wafer and the scale width of each color are specified; an image drawing 704 in which of the six feature quantities f1 through f6 of a sectional shape of the resist pattern of the FEM wafer is displayed; and a graph 705 in which relations between exposure conditions and feature quantities of sectional shapes of resist patterns of the FEM wafer are shown.

The chip table 701 shows the positions of all chips in the FEM wafer in a matrix. That is, the uppermost row in the chip table 701 shows the column numbers (0 through 10) of chips in the FEM wafer, and the next row shows offset amounts (focuses) of focus positions as exposure conditions of each chip. The most left column in the chip table 701 shows a row number (7 through 0) of a chip on the FEM wafer, and the next column shows exposure amounts (doses) of each chip as an exposure condition. In the present example, the chips on the FEM wafer are arranged in a matrix form of eight rows eleven columns.

Feature quantities of the sectional shapes of resist patterns of the FEM wafer are displayed with colors at each chip position in the chip table 701, that is, in each cell of the matrix. In the example of shown in the figure, a white band width f2 is selected as a feature quantity of the sectional shape of the resist pattern of the FEM wafer as shown in the image-drawing 704. In the color display area 702, a user may specify a warm, or a cold color as a color of a chip in the chip table 701. The color of a chip is changed corresponding to a deviation of a feature quantity of a sectional shape of a resist pattern of a FEM wafer to an appropriate value. The present example uses changes in gradations of a cold, or warm color. Instead of the cold, or warm color, a method using a grayscale may be realized. However, deviations of feature quantities may be more visually discriminated by the display using the cold, or warm color in comparison with that of the display using the grayscale.

The input area 703 has an area (Std) in which an appropriate value of a feature quantity of a sectional shape of a resist pattern of a FEM wafer is input, and an area (Scale) in which a scale width representing each color is input. A user inputs a desired value into the input area 703, and depresses an "Apply" button.

In the present example, 2.00 is specified in the input area 703 as a scale width representing each color, and 39.62 is specified as an appropriate value of the white band width f2 of a sectional shape of the resist pattern of the FEM wafer. Accordingly, the appropriate range of the white band width f2 is from 38.62 through 40.62. A color specified in the color display area 702 is displayed at a position of a chip having an appropriate value. It is assumed in the present example that yellow is specified in the color display area 702 for chips with a value of the white band width f2 of from 38.62 through 40.62. When the width f2 of the white band is deviated from the appropriate value, a color corresponding to the deviation is displayed. Here, "E" is displayed in the color display area 702 when a measurement result of the white band width f2 is an error.

Relations between exposure conditions and feature quantities of sectional shapes of resist patterns of the FEM wafer are displayed as graphs in the graph 705. The vertical axis in the graph 705 indicates white band widths f2, and the horizontal axis indicates offset amounts (focuses) of focus positions. The graphs are displayed for each exposure amount.

There may be performed "conditioning operation", using the chip table 701 in the present example. A chip in which the white band width f2 is in an appropriate range is searched from chips in the chip table 701. The chip which has a white band width f2 in an appropriate range is yellow in the present example. Accordingly, a yellow chip may be found out. Acceptably, instead of the yellow chip, a chip in which a value f2 of the white band width is from 38.62 to 40.62. When there are found a plurality of chips, one of the above chips is selected. In the above case, a chip approximately at the center among a plurality of chips is acceptably selected. An exposure condition for the above-selected chip is an appropriate exposure condition. An offset amount (focus) at a focus position of the second row from the top in the chip table 701, and an exposure amount (dose) at the second column from the left may be read as the exposure condition.

For example, the white band width f2 of a chip at a row number of 4 and a column number of 4 is 40.40, and yellow. The above width is in an appropriate range of the white band width f2. The offset amount (focus) of a focus position may be read as −70.0, and the exposure amount (dose) thereof may be read as 16.000 for an exposure condition of the above chip. The above data is an optimal exposure condition. Thus, "conditioning operation" may be visually and easily performed in the present example, using the chip table 701.

Not only "conditioning operation", but also an inappropriate exposure condition may be detected, using the chip table 701 in the present example. In the chip table 701, there is searched a chip in which the white band width f2 is extremely deviated from an appropriate range. In the color display area 702, a color may be searched from the chip table 701, wherein the color is given to a chip in which the value of the white band width f2 is extremely shifted from an appropriate range. Alternatively, a chip is acceptably searched wherein the chip has a value as the white band width f2 and the value is extremely shifted from an appropriate range. For example, the white band width f2 of a chip at a row number of 3 and a column number of 7 is 19.10, and is extremely shifted from an appropriate range. For an exposure condition of this chip, the offset amount (focus) may be read as 140.0, and the exposure amount (dose) at a focus position may be read as 15.200. Then, the above exposure condition is judged to be an inappropriate exposure condition. Furthermore, the graph 705 may be used to detect an inappropriate exposure condition. In the graph 705, it is understood that a graph with an exposure amount of 15.200 has a point which extremely shifts from an appropriate range. When a value on the horizontal axis for the above point are read, it may be read that the white band width f2 is slightly smaller than 20, and the offset amount (focus) of the focus position is 140.0.

Figure 8:
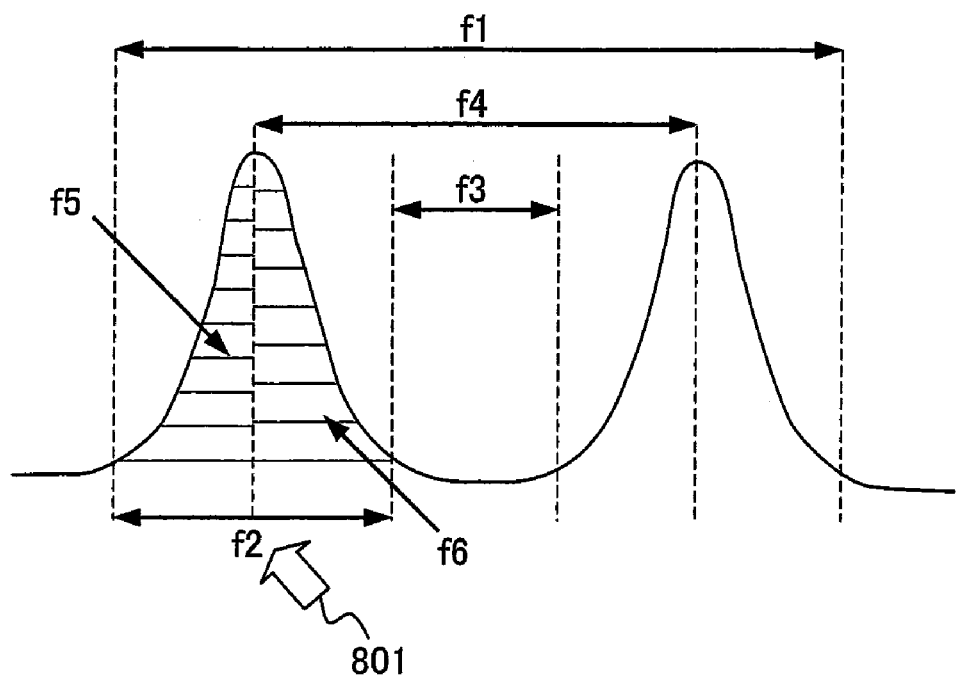
FIG. 8 is a view showing the details of an image drawing on a screen shown in FIG. 6.

FIG. 8 shows the details of the image drawing 704 in FIG. 6. In the above image drawing, the feature quantities f1 through f6 of the sectional shape of the resist pattern of the FEM wafer are shown on the graph. A user may specify one of f1 through f6 using a cursor 801. Thus, in the present example, a user may specify one of the feature quantities f1 through f6 in a state in which the user understands the meaning.

As described above, the following advantages are obtained according to the system of displaying an exposure condition according to the present invention.

(1) A feature quantity of a sectional shape of a resist pattern of a FEM wafer is displayed in units of a chip in a chip table. Accordingly, measurement results of dimensions of sectional shapes in resist patterns of a FEM wafer may be evaluated based on the coordinates of chip positions.

(2) Chip colors in the chip table are expressed in a cold or warm color, corresponding to deviations in feature quantities of sectional shapes of resist patterns of a FEM wafer to an appropriate value. Therefore, a position of a chip without an appropriate value of a feature quantity of a sectional shape of a resist pattern of a FEM wafer may be visually and easily judged.

(3) A graph is displayed, assuming that a parameter is an exposure amount, the vertical axis indicates feature quantities of a sectional shape of a resist pattern of a FEM wafer, and the horizontal axis indicates an offset amount (focus) of a focus position. Accordingly, variances in feature quantities of a sectional shape of a resist pattern of a FEM wafer may be quantitatively judged. Therefore, the process variation may be visually detected.

Though examples according to the present invention have been explained as described above, it will be easily appreciated by persons skilled in the art that the present invention is not limited to the above-described examples, and various modifications may be made within the scope of the invention described in claims.

What is claimed is:

1. A method of displaying an exposure condition using a computer having an input device through which a user inputs data and instructions, a display device for displaying data and processing results of data, and an information processing portion for various kinds of information processing, comprising the steps of:

an image information reading processing for acquiring a scanning electron microscope image of a FEM wafer, on the surface of which the same resist patterns exposed on different exposure conditions for each chip are formed;

a feature quantity calculation processing for calculating a feature quantity of a sectional shape of a resist pattern of said FEM wafer from the scanning electron microscope image of said FEM wafer;

a feature quantity deviation calculation processing for obtaining a feature quantity deviation of a sectional shape of resist pattern of said FEM wafer to an appropriate value;

a map drawing processing for making a chip table displaying the positions of chips on said FEM wafer in a matrix;

a feature quantity display processing for displaying a feature quantity of a sectional shape of a resist pattern of said FEM wafer at each chip position in said chip table;

a color display processing for displaying a cold or warm color at each chip position in said chip table, said color representing a deviation in feature quantities of a sectional shape of a resist pattern to said appropriate value; and a display processing for displaying said chip table on a display device, said chip table displaying a feature quantity and a color of a sectional shape of a resist pattern of said FEM wafer for each chip on said FEM wafer.

2. The method of displaying an exposure condition according to claim 1, wherein in said image information reading processing, said scanning electron microscope image of said FEM wafer is acquired using a scanning electron microscope with a length measuring function.

3. The method of displaying an exposure condition according to claim 1, further comprising a graph display processing for generating a graph displaying changes in feature quantities of a sectional shape of a resist pattern of said FEM wafer to variations in exposure conditions, and for displaying said graph on said display device.

4. The method of displaying an exposure condition according to claim 1, comprising an input area display processing for displaying an input area on said display device, said input area specifying an appropriate value of feature quantity of a sectional shape of a resist pattern of said FEM wafer, a color corresponding to a deviation of said feature quantity to said appropriate value, and a scale width of a variation width of said feature quantity corresponding to each color.

5. The method of displaying an exposure condition according to claim 4, wherein
when a user specifies said appropriate value and scale widths of said color in said input area through said input device in said input area display processing, colors specified by a user and a scale width of said feature quantity corresponding to said colors are displayed on said display device.

6. The method of displaying an exposure condition according to claim 1, wherein
in said feature quantity calculation processing, a graduation value of a lightness and a darkness is extracted from a scanning electron microscope image of said FEM wafer to generate a secondary electron signal strength distribution, and said feature quantity is calculated from said secondary electron signal strength distribution.

7. The method of displaying an exposure condition according to claim 1, wherein
said feature quantity of a sectional shape of a resist pattern of said FEM wafer, which is calculated in said feature quantity calculation processing, is at least one of
a bottom width f1 representing a broadest width of a root portion in a sectional shape of a resist pattern of said FEM wafer,
a white band width f2 representing the width of each inclination portion on the both sides of the sectional shape of a resist pattern of said FEM wafer,
a top width f3 representing the width of a flat top portion of the sectional shape of a resist pattern of said FEM wafer,
a maximum inclination point interval f4 representing a distance between maximum inclination points in the inclination portions on both sides of a sectional shape of a resist pattern of said FEM wafer,
average inside width f5 of the white band representing a dimension of a transition portion from an inclination portion to a top portion in the sectional shape of a resist pattern of said FEM wafer, and
an average outside width f6 of a white band representing the dimension of a transition portion from a root portion to a inclination portion in the sectional shape of a resist pattern of said FEM wafer.

8. A system of displaying an exposure condition having an input device through which a user inputs data and an instruction, a display device for displaying data and a processing result of said data, and a visual information management portion for various kinds of information processing,
said visual information management portion having:
an image information reading processing portion for acquiring a scanning electron microscope image of a FEM wafer, on the surface of which same resist patterns exposed on different exposure conditions for each chip are formed;
a feature quantity calculation processing portion for calculating a feature quantity of a sectional shape of a resist pattern of said FEM wafer from said scanning electron microscope image of said FEM wafer;
a feature quantity deviation calculation processing portion for obtaining a feature quantity deviation of the sectional shape of a resist pattern of said FEM wafer to an appropriate value;

a map drawing processing portion for making a chip table displaying positions of chips on said FEM wafer in a matrix;
a feature quantity displaying processing portion for displaying a feature quantity of a sectional shape of a resist pattern of said FEM wafer at each chip position in said chip table; and
a color display processing portion for displaying a cold or warm color representing a deviation of a feature quantity of a sectional shape of a resist pattern to said appropriate value at each chip position in said chip table, and
said display device displaying said chip table in which a feature quantity and a color of a sectional shape of a resist pattern of said FEM wafer is displayed for each chip on said FEM wafer.

9. The system of displaying an exposure condition according to claim 8, wherein
said image information reading processing portion obtains a scanning electron microscope image of said FEM wafer from a scanning electron microscope with a length measuring function.

10. The system of displaying an exposure condition according to claim 8, wherein
said visual information management portion has a graph display processing portion for generating a graph display playing changes in feature quantities of a sectional shape of a resist pattern of said FEM wafer to a variation in said exposure condition, and
said display device displays a graph generated by said graph display processing portion.

11. The system of displaying an exposure condition according to claim 8, wherein
said display device displays an appropriate value of a feature quantity of a sectional shape of a resist pattern of said FEM wafer, a color corresponding to a deviation in said feature quantity to said appropriate value, and an input area which specifies a scale width of a variation width in said feature quantity corresponding to colors, and
a user may specify said appropriate value and a scale width of said colors in said input area through said input device.

12. The system of displaying an exposure condition according to claim 11, wherein
said display device displays a color specified by a user, and a scale width of said feature quantity corresponding to colors.

13. The system of displaying an exposure condition according to claim 8, wherein
said feature quantity deviation calculation processing portion extracts a graduation value of lightness and darkness from a scanning electron microscope image of said FEM wafer to generate a secondary electron signal strength distribution, and to calculate said feature quantity from said secondary electron signal strength distribution.

14. The system of displaying an exposure condition according to claim 8, wherein
said feature quantity of a sectional shape of a resist pattern of said FEM wafer is at least one of a bottom width f1 representing the broadest width of a root portion in a sectional shape of a resist pattern of said FEM wafer, a white band width f2 representing the widths of inclination portions on the both sides of a sectional shape in a resist pattern of said FEM wafer, a top width f3 representing the width of a flat top portion in a sectional shape of a resist pattern of said FEM wafer, a maximum inclination point interval f4 representing a distance between maximum inclination points in the inclination portions on both sides of a sectional shape of a resist pattern of said FEM wafer, an average inside width f5 of the white band representing a dimension of a transition portion from the inclination portion to the top portion of a sectional shape of a resist pattern of said FEM wafer, and an outside average width f6 of a white band representing a dimension of a transition portion from a root portion to an inclination portion in the sectional shape of a resist pattern of said FEM wafer.

15. A method of setting an exposure condition using a computer which has an input device through which a user inputs data and an instruction, a display device displaying data and a data processing result, and an information processing portion for various kinds of information, comprising:

an image information reading processing for acquiring a scanning electron microscope image of a FEM wafer on the surface of which a same resist pattern exposed on different exposure conditions for each chip is formed;

a feature quantity calculation processing for calculating a feature quantity of a sectional shape of a resist pattern of said FEM wafer from a scanning electron microscope image of said FEM wafer;

a feature quantity deviation calculation processing for obtaining a deviation of a feature quantity of a sectional shape of a resist pattern of said FEM wafer to an appropriate value;

a map drawing processing for making a chip table displaying positions of chips on said FEM wafer in a matrix;

a feature quantity processing for displaying a feature quantity of a sectional shape of a resist pattern of said FEM wafer at each chip position in said chip table;

a color display processing for displaying a cold or warm color representing a feature quantity deviation of a sectional shape of a resist pattern to said appropriate value is displayed at each chip position in said chip table;

a display processing for displaying said chip table on a display device, said chip table displaying a feature quantity and a color of a sectional shape of a resist pattern of said FEM wafer for each chip on said FEM wafer;

a processing for finding a chip with a small feature quantity deviation of a sectional shape of a resist pattern of said FEM wafer from said chip table; and a setting processing for setting exposure condition corresponding to a chip with said small deviation as the optimal exposure condition.

16. The method of setting an exposure condition according to claim 15, further comprising a graph display processing for generating a graph, in which changes in feature quantities of a sectional shape of a resist pattern of said FEM wafer to variation in exposure conditions is displayed, and for displaying said graph on said display device.

* * * * *